United States Patent [19]

Ratner

[11] Patent Number: 5,506,535
[45] Date of Patent: Apr. 9, 1996

[54] CMOS INPUT LEVEL-SHIFTING PAD

[75] Inventor: Steven J. Ratner, Santa Clara, Calif.

[73] Assignee: Hewlett-Packard Company, Palo Alto, Calif.

[21] Appl. No.: 281,897

[22] Filed: Jul. 28, 1994

[51] Int. Cl.[6] ............................................. H03K 19/0175
[52] U.S. Cl. ............................... 327/333; 326/63; 326/80; 326/81
[58] Field of Search ............................. 327/333; 326/62, 326/70, 71, 72, 75, 76, 80, 81, 86, 63, 68

[56] References Cited

U.S. PATENT DOCUMENTS

5,023,487  6/1991  Wellheuser et al. ..................... 326/66
5,352,942  10/1994  Tanaka et al. ........................... 326/63

Primary Examiner—Timothy P. Callahan
Assistant Examiner—Jung Ho Kim
Attorney, Agent, or Firm—Pamela Lau Kee; John L. Imperato

[57] ABSTRACT

An I/O circuit that provides bidirectional signal access to an integrated circuit (IC) core has voltage transformation capability to manage different voltage requirements. Although the I/O circuit and the core are fabricated from the same IC process, the I/O circuit can operate at non-process constrained voltages. The I/O circuit provides an output signal at the necessary voltage level to drive a component in the discrete environment while limiting the voltage supplied to the IC core to the maximum device voltage defined by the selected process.

7 Claims, 10 Drawing Sheets

CM OS INPUT LEVEL-SHIFTING PAD

FIELD OF THE INVENTION

The present invention relates to integrated circuits and, more specifically, to I/O circuit providing hi-directional signal access for integrated circuits. The invention provides for an I/O circuit pad that manages mismatched voltage requirements between an integrated circuit core and the discrete environment while being operated within the same voltage requirements as the integrated circuit core.

BACKGROUND OF THE INVENTION

The trend in CMOS-based processing technology is to produce integrated circuit (IC) cores having a higher density of transistors and faster clock rates than their predecessors. I/O signals, which electrically connect the IC core to external components in the discrete environment, are accessed through I/O circuit pads that surround the IC core. The IC core and the I/O circuit pads are generally fabricated from the same processing technology. The performance of the IC core is improved by shrinking the feature sizes of the devices, such as field-effect transistors (FETs). Unfortunately, reducing the feature sizes proportionally decreases the maximum operating voltage that the FETs can withstand. For example, an I/O circuit pad, fabricated from a CMOS process having 0.5 micron features, withstands a maximum operating voltage of ~3.6 volts. The maximum operating voltage of the I/O circuit pad is insufficient to drive the external components which have a higher voltage requirement, typically 5 volts. Furthermore, if the IC is driven at greater than the maximum operating voltage, the IC will fail.

One attempt to resolve the mismatched voltage requirements is to increase the robustness of the fabrication process by increasing the thickness of the gate-oxide layer. A thick gate-oxide layer provides each and every FET ability to support the higher voltage requirement. However, this robustness decreases the performance of the IC because the overall gain of the IC is reduced. Reducing the gain minimizes the beneficial reasons which occur by reducing the feature size.

Other attempts have included increasing the complexity of the CMOS fabrication process so there are two sets of devices where each set meet different voltage requirements. Each set of devices requires a different gate-oxide and a different polysilicon deposition. Each additional deposition requires a separate mask. The resulting hybrid process increases the manufacturing costs of the IC.

One way to avoid the aforementioned processing-based solutions is to use a "level-shift" chip as an external component. The IC core and the I/O circuit pads are fabricated from the same process. The "level-shift chip" is fabricated from a process that supports the discrete voltage requirement by stepping up the core output signals to support the discrete voltage range and stepping down the external drive signals to support the IC core voltage range. This chip is a waste of much needed space on the printed circuit board and degrades performance.

An I/O circuit that transforms voltages between different voltage requirements without degrading the overall performance of the integrated circuit and maximizing use of space on the printed circuit board or multi-chip substrate could be beneficial. It would be a further benefit if this I/O circuit and the IC core were fabricated from the same process to minimize manufacturing costs.

SUMMARY OF THE INVENTION

An I/O circuit to access and provide signals to an integrated circuit (IC) core has bidirectional voltage transformation capability to manage differing voltage requirements between the IC core and a discrete environment, such as a printed circuit board or multi-chip module. Although the I/O circuit and the core are fabricated during the same processing steps, the I/O circuit can receive and drive signals at non-process constrained voltages.

The I/O circuit is implemented in four blocks: core buffer, shift-up, shift-down, and a discrete buffer. The core buffer is connected between a first voltage supply and ground. The first voltage supply matches a process-constrained voltage range, the maximum operating voltage of the core. The discrete buffer block is connected between a second voltage supply which matches a discrete voltage requirement and ground.

The core buffer receives a core output signal from the IC core which is passed to the shift-up block. The core output signal is shifted in voltage to produce a core value signal that corresponds to the core output signal. The core value signal has either a "HIGH" value or a "LOW" value which is received by the discrete buffer. The discrete buffer block produces a "HIGH" or "LOW" value on the output terminal that matches the discrete voltage range.

For signals that drive the IC core, the discrete buffer block receives a discrete input signal from a component in the discrete environment that is passed to the shift-down block. The shift-down block scales the discrete input signal to be within the IC voltage range and produces a discrete value signal. The discrete value signal is received by the core buffer which generates a core input signal corresponding to the discrete input signal but matching the IC voltage range.

A CMOS fabrication process that supports a single maximum operating voltage for each and every field-effect transistor has two process-related design concerns: maximum operating voltage for the gate oxide and that of the drain to source junction. Although the maximum operating voltage for each PET is less than that of the discrete voltage requirement, the IC voltage may be stepped up to match the discrete voltage range. Accordingly, a voltage level in the discrete voltage range may be stepped down to match the IC voltage range. Fabricating the I/O circuit and the IC core with the same processing steps minimizes manufacturing costs while retaining the performance gained as the feature sizes of the CMOS processes shrink. Unlike past designs, the shift-up and shift-down blocks have the same performance characteristics as the IC core. Thus, the overall performance characteristics between the IC core and the discrete environment are improved.

DETAILED DESCRIPTION OF THE PREFERRED EMBODIMENTS

An I/O circuit that provides bidirectional signal access to an integrated circuit (IC) core has voltage transformation capability to manage different voltage requirements. Although the I/O circuit and the core are fabricated from the same IC process, the I/O circuit can operate at non-process constrained voltages. The I/O circuit provides an output signal at the necessary voltage level to drive a component in the discrete environment while limiting the voltage supplied to the IC core to the maximum device voltage defined by the selected process.

Figure 1:
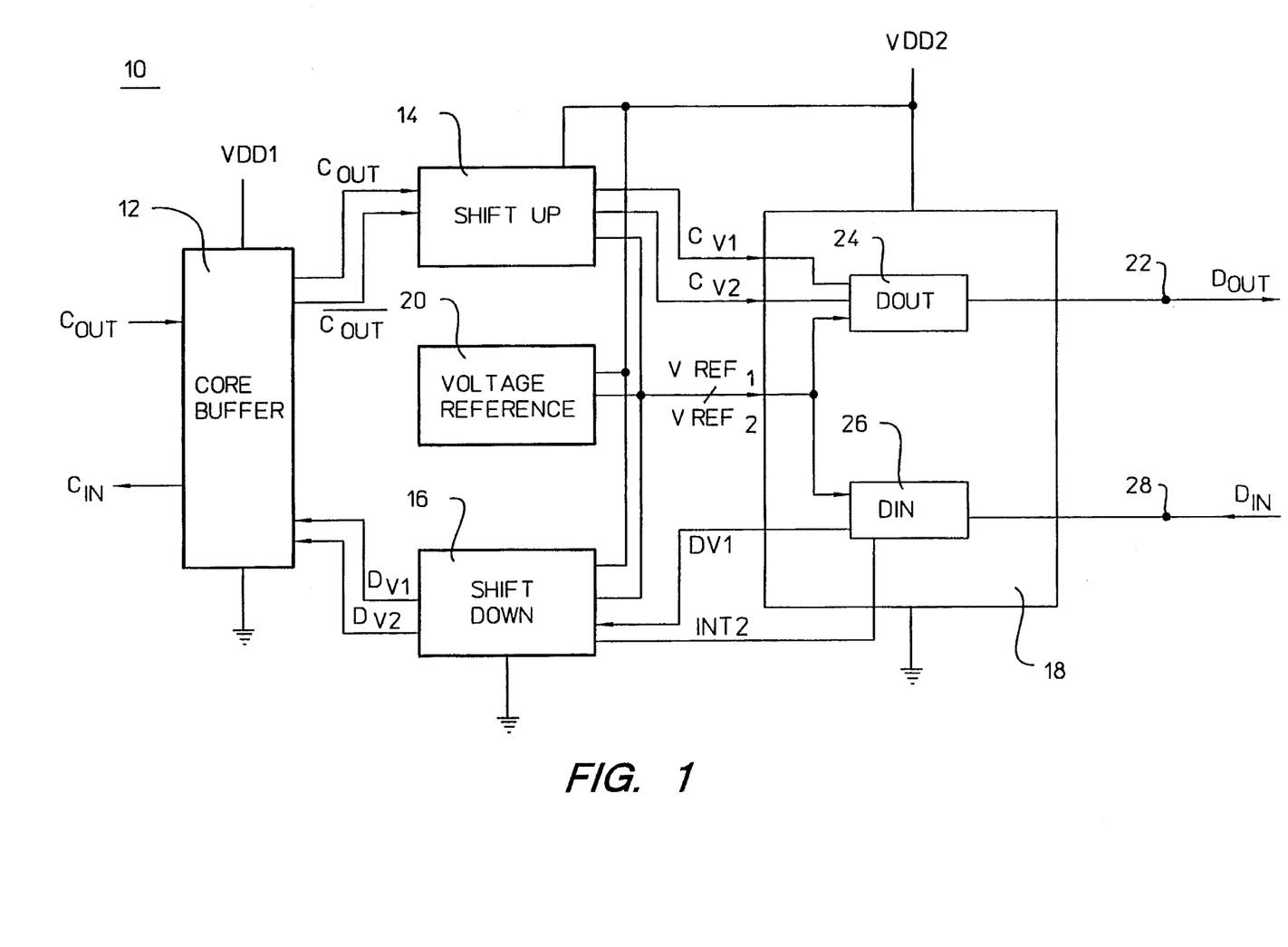
FIG. 1 illustrates a functional block diagram of an I/O circuit according to the present invention.

FIG. 1 illustrates a functional block diagram of an I/O circuit 10. A core buffer block 12 is connected between a first voltage supply VDD1 and around. The first voltage supply VDD1 corresponds to the maximum device voltage for field-effect transistors (FETs) used in an IC core (not shown) to maintain the desired performance of the IC core. The core buffer block 12 is connected to a shift-up block 14 and a shift-down block 16. Both, the shift-up and shift-down blocks 14, 16, are connected to an discrete buffer block 18. The discrete buffer block 18 is further connected to a voltage reference block 20. The discrete buffer block 18 is connected between a second voltage supply VDD2 and ground. The second voltage supply VDD2, typically 5 volts, corresponds to the voltage necessary to drive a component (not shown) in the discrete environment.

The IC core sends a core output signal $C_{OUT}$ to the core buffer block 12. The core output signal $C_{OUT}$ is passed to the shift-up block 14 which produces two core value signals $C_{V1}$, $C_{V2}$, each having one of two values: "low" or "high", that represents the core output signal $C_{OUT}$. The discrete buffer block 18 generates a discrete output signal $D_{out}$ on an output terminal 22 that is scaled to the drive voltage and according to the core value signals $C_{V1}$, $C_{V2}$.

The discrete buffer block 18, which contains two blocks DIN 26 and DOUT 24, receives a discrete input signal $D_{IN}$ from the component at an input terminal 28. The shift-down block 16 produces two discrete value signals $D_{V1}$, $D_{V2}$ that correspond to the discrete input signal $D_{IN}$. The core buffer block 12 generates a core input signal $C_{IN}$ scaled to the maximum device voltage and according to the discrete value signal $D_V$.

Figure 2:
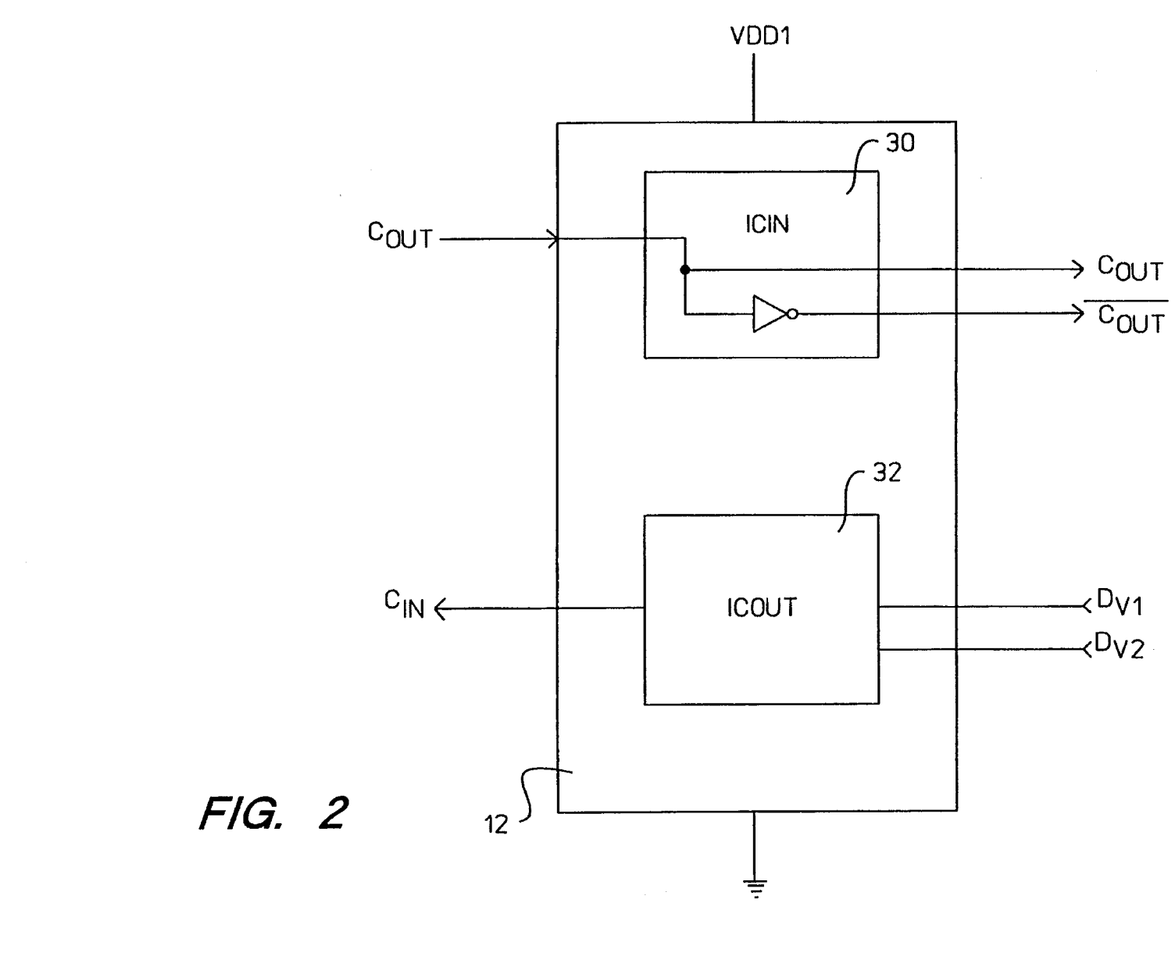
FIG. 2 illustrates the core buffer shown in FIG. 1.

FIG. 2 illustrates the core buffer block 12 shown in FIG. 1. The core buffer block 12 contains two blocks: ICIN 30 and ICOUT 32. ICIN 30 receives the core output signal $C_{OUT}$ from the IC core and passes the core output signal $C_{OUT}$ to the shift-up block 14. ICOUT 32 receives the discrete value signal $D_V$ from the shift-down block 16 and outputs the core input signal $C_{IN}$ which corresponds to the discrete input signal $D_{IN}$ but at a voltage that is within the IC voltage range.

Figure 3:
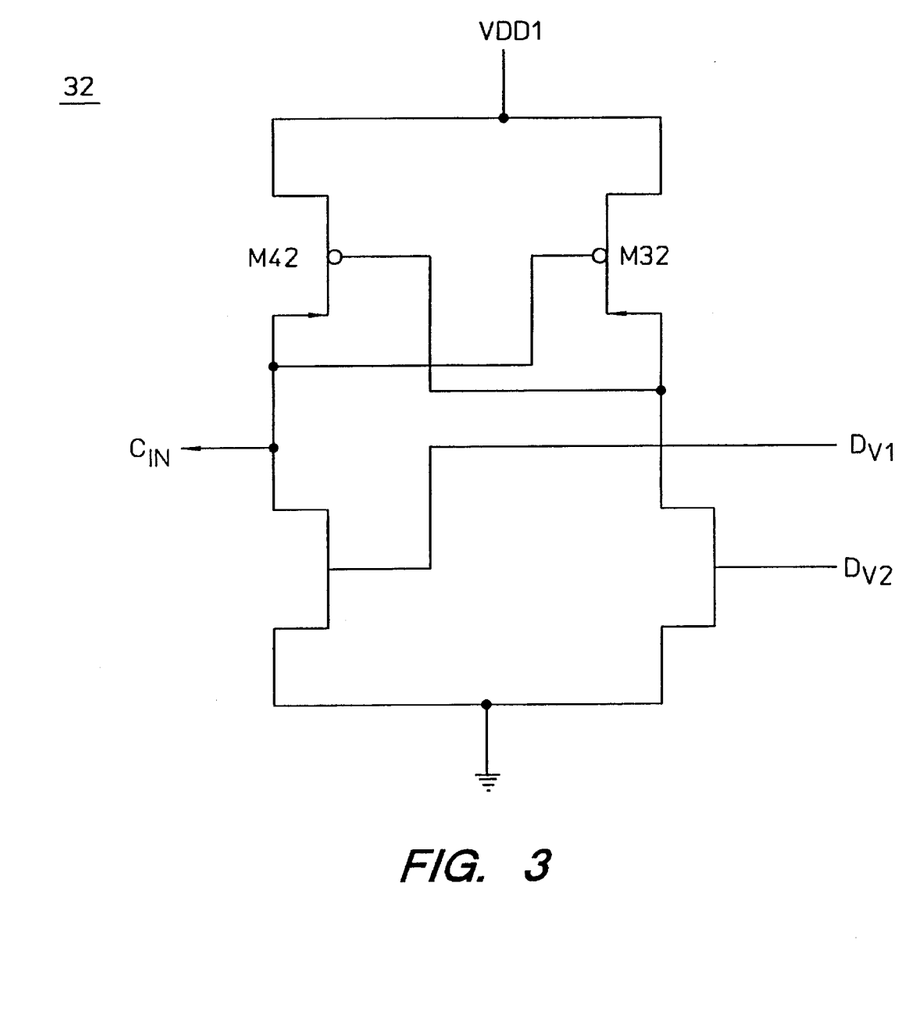
FIG. 3 illustrates the circuit schematic diagram of the ICOUT block shown in FIG. 2.

FIG. 3 illustrates the circuit schematic diagram of the functional block ICOUT 32 shown in FIG. 2.

Figure 4:
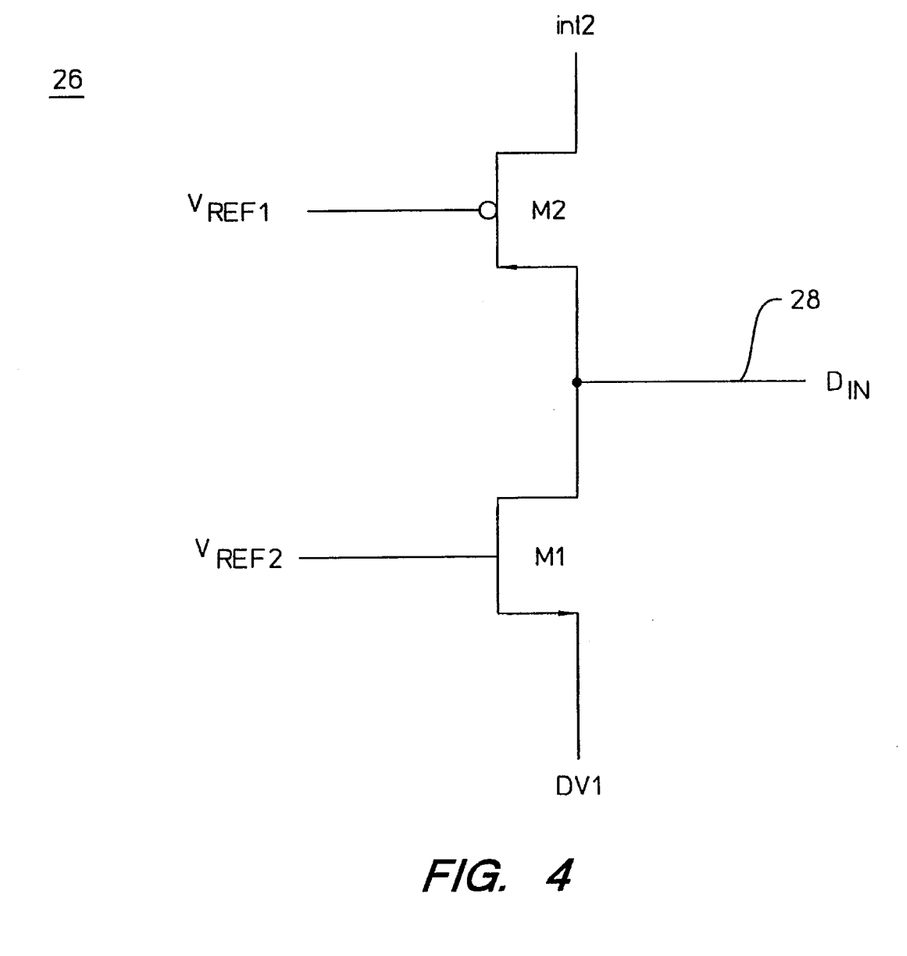
FIG. 4 illustrates the circuit schematic diagram of the DIN block shown in FIG. 1.

FIG. 4 illustrates the DIN block 26 of the discrete buffer block 18 shown in FIG. 1. The DIN block 26 contains a p-channel device M2 and a n-channel device M1 connected in series. The drain of p-channel device M2 is connected to the drain of n-channel device M1 at input node 28. The discrete input signal $D_{IN}$ enters the discrete buffer block 18 at input node 28 and is then available at the source of n-channel device M1.

Figure 5:
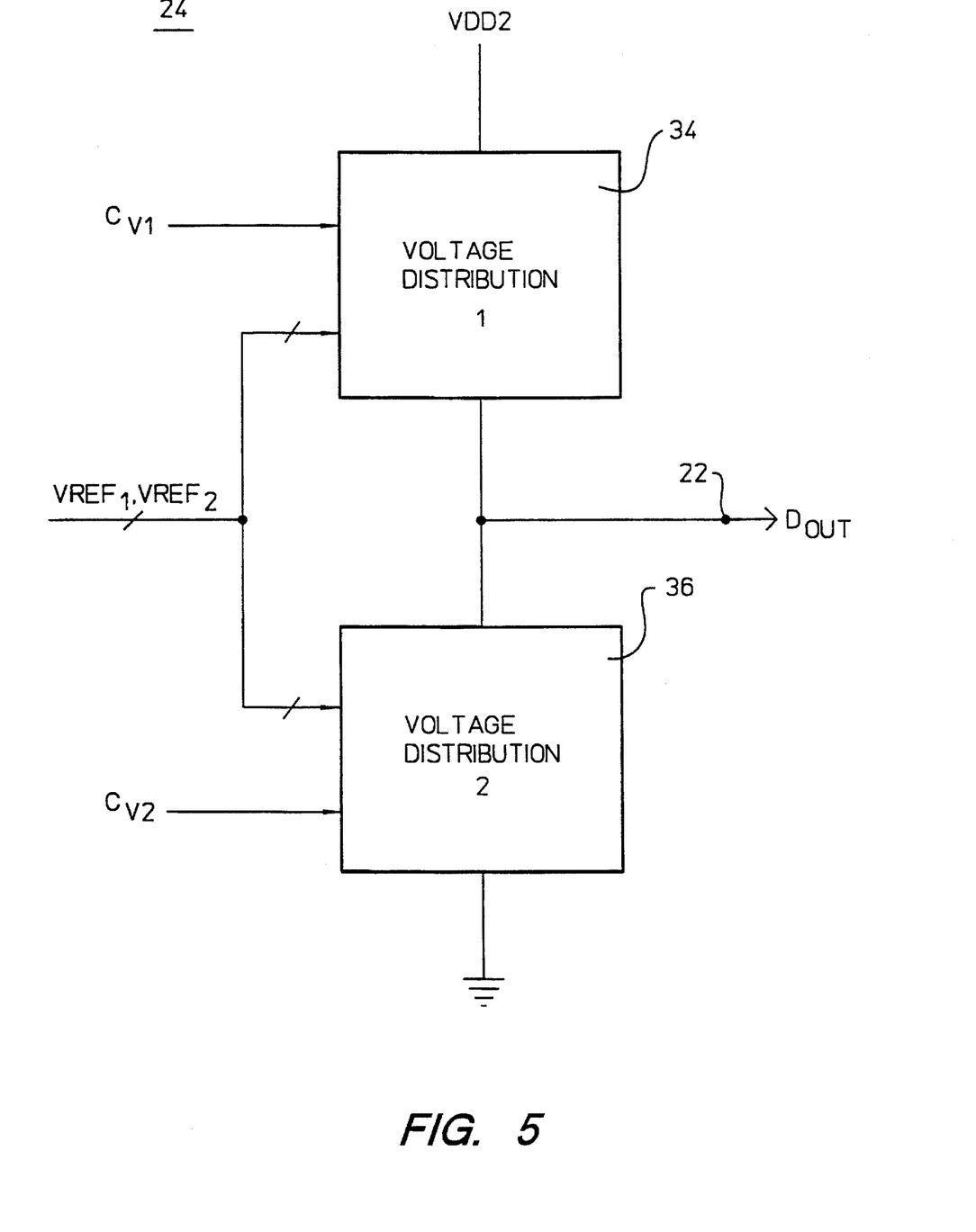
FIG. 5 illustrates the DOUT block shown in FIG. 1.

FIG. 5 illustrates the DOUT block 24 shown in FIG. 1. The DOUT block 24 contains a first and a second voltage distribution circuits 34, 36 connected in series. The first voltage distribution circuit 34 is connected to the second voltage supply VDD2, the shift-up block 14, and the output terminal 22. The second voltage distribution circuit 36 is connected to the output terminal 22, the shift-up block 14, and ground.

Figure 6:
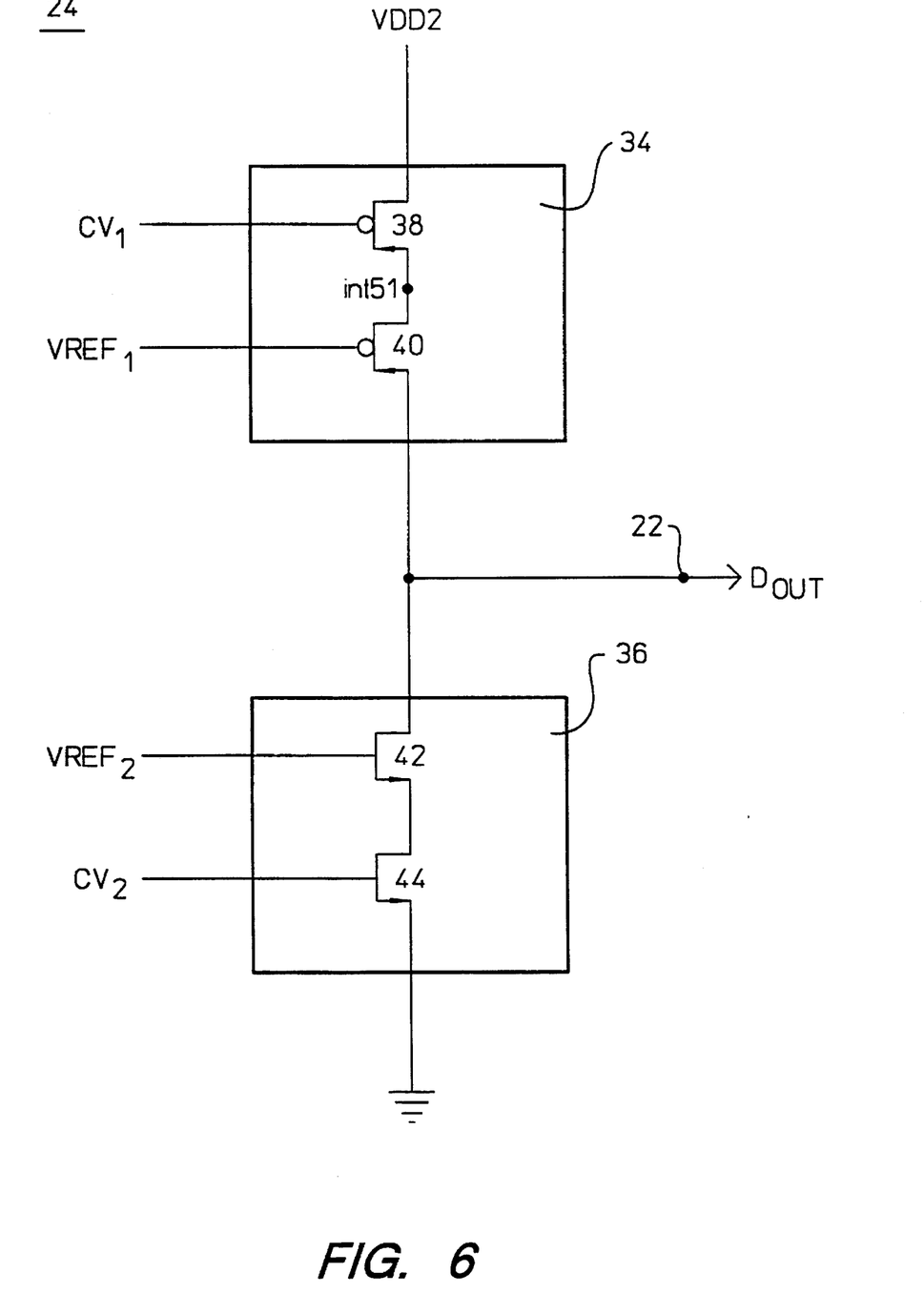
FIG. 6 illustrates the circuit schematic diagram of the DOUT block shown in FIG. 5.

FIG. 6 illustrates the circuit schematic diagram of the DOUT block shown in FIG. 5. The first voltage distribution circuit 34 contains a first p-channel device 38 that has a source connected to the second voltage supply VDD2, a gate connected to the shift-up block 14, and a drain. A second p-channel device 40 has a source connected to the drain of the first p-channel device 38, a gate attached to the voltage reference block 20, and a drain connected to the output terminal 22. The first reference signal $VREF_1$ biases the first voltage distribution circuit 34.

The second voltage distribution circuit 36 contains a first n-channel device 42 that has a drain connected to the output terminal 22, a gate connected to the voltage reference block 20, and a source. A second n-channel device 44 has a drain connected to the source of the first n-channel device 42, a gate connected to the shift-up block 14, and a source connected to ground. The second reference signal $VREF_2$ biases the second voltage distribution circuit 36.

When the core output signal $C_{OUT}$ has a low value, the discrete output signal $D_{OUT}$ has a corresponding high value. The voltage reference signals $VREF_1$ and $VREF_2$ act in concert to cause the second p-channel device 40 to behave as a source follower and the first n-channel device 42 to act as a transmission gate. When the core output signal $C_{OUT}$ has a high value, the discrete output, signal $D_{OUT}$ has a corresponding low value. The voltage reference signals $VREF_1$ and $VREF_2$ act in concert to cause the second p-channel device 40 to behave as a transmission gate and the first n-channel device 42 to act as a source follower.

For each voltage distribution circuit, the drive voltage is distributed over two devices. As maximum operating voltages diminish with higher performance devices, additional devices will be needed to distribute voltage and retain performance. This would be accomplished by supplying additional voltage reference signals to each of the voltage distribution circuits to bias the internal nodes between the devices. The two separate blocks: DIN, DOUT, may be controlled by a tri-state buffer to provide the I/O circuit, with bidirectional signal access and a disabled mode.

Figure 7:
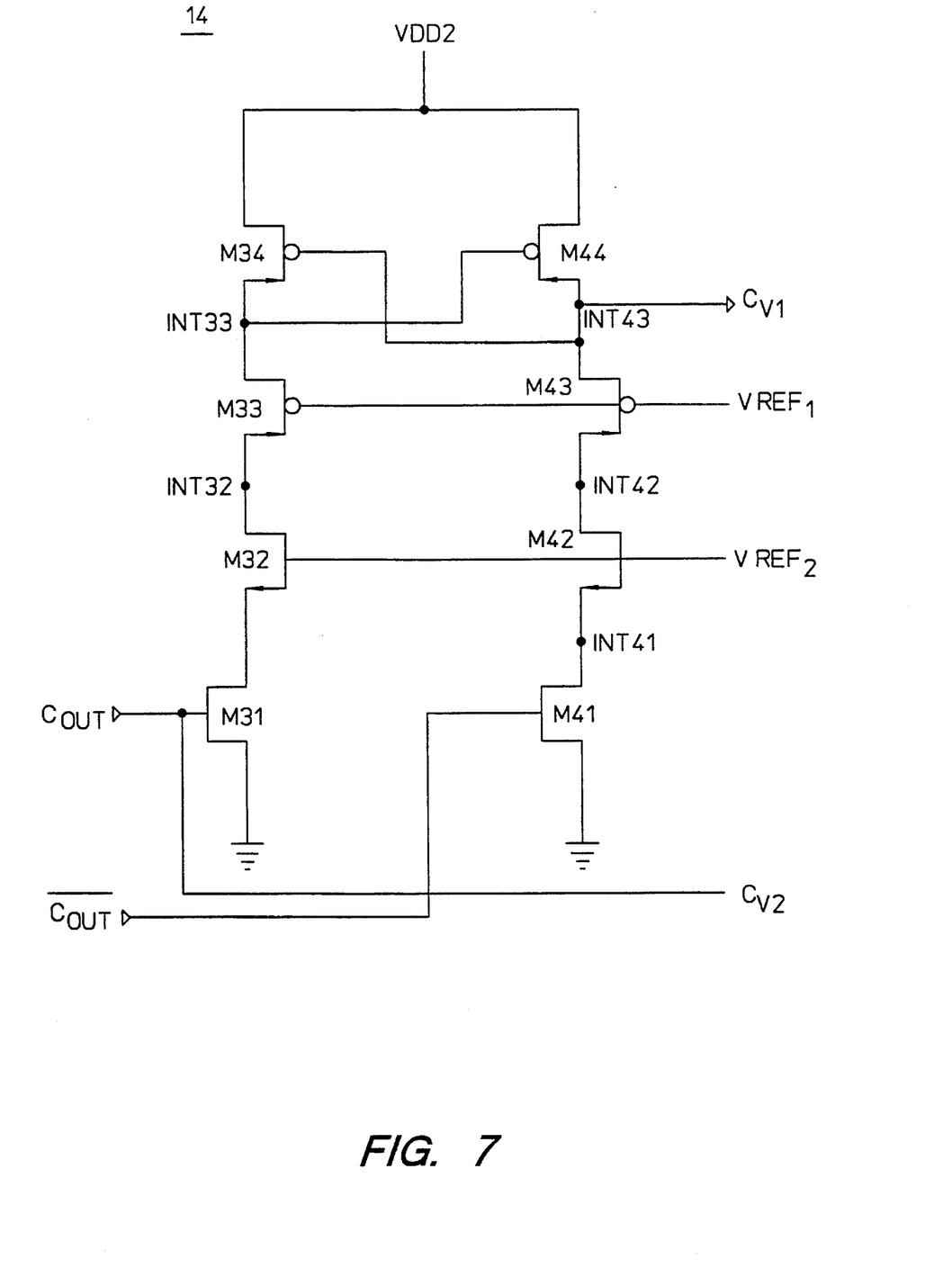
FIG. 7 is a circuit schematic diagram of the shift-up block shown in FIG. 1.

FIG. 7 is a circuit schematic diagram of the shift-up block 14 shown in FIG. 1. The sources of p-channel devices M34 and M44 are connected to the second voltage supply VDD2. The gate of M44 is connected to the drain of M34 while the gate of M34 is connected to the drain of M44 thus forming a cross connection. Each gate of p-channel devices M33 and M43 receives the first reference signal $VREF_1$ from the voltage reference block 20. The source of M33 is connected to the drain of M34 at node int33 and the source of M43 is connected to the drain of M44 at node int43. The core value signal $C_{V1}$ available at node int43 will subsequently be used by the discrete buffer block 18.

Each gate of n-channel devices M32 and M42 receives the second reference signal $VREF_2$ from the voltage reference block 20. The drain of M32 is connected to the drain of M33 at node int32 while the drain of M42 is connected to the drain of M43 at node int42. The sources of n-channel devices M31 and M41 are both connected to ground. The gate of M31 is connected to the core buffer block 12 and the drain of M31 is connected to the source of M32 at node int31. The gate of M41 receives the inverted core output signal $\overline{C_{OUT}}$ and the drain of M41 is connected to the source of M42 at node int41.

Figure 8:
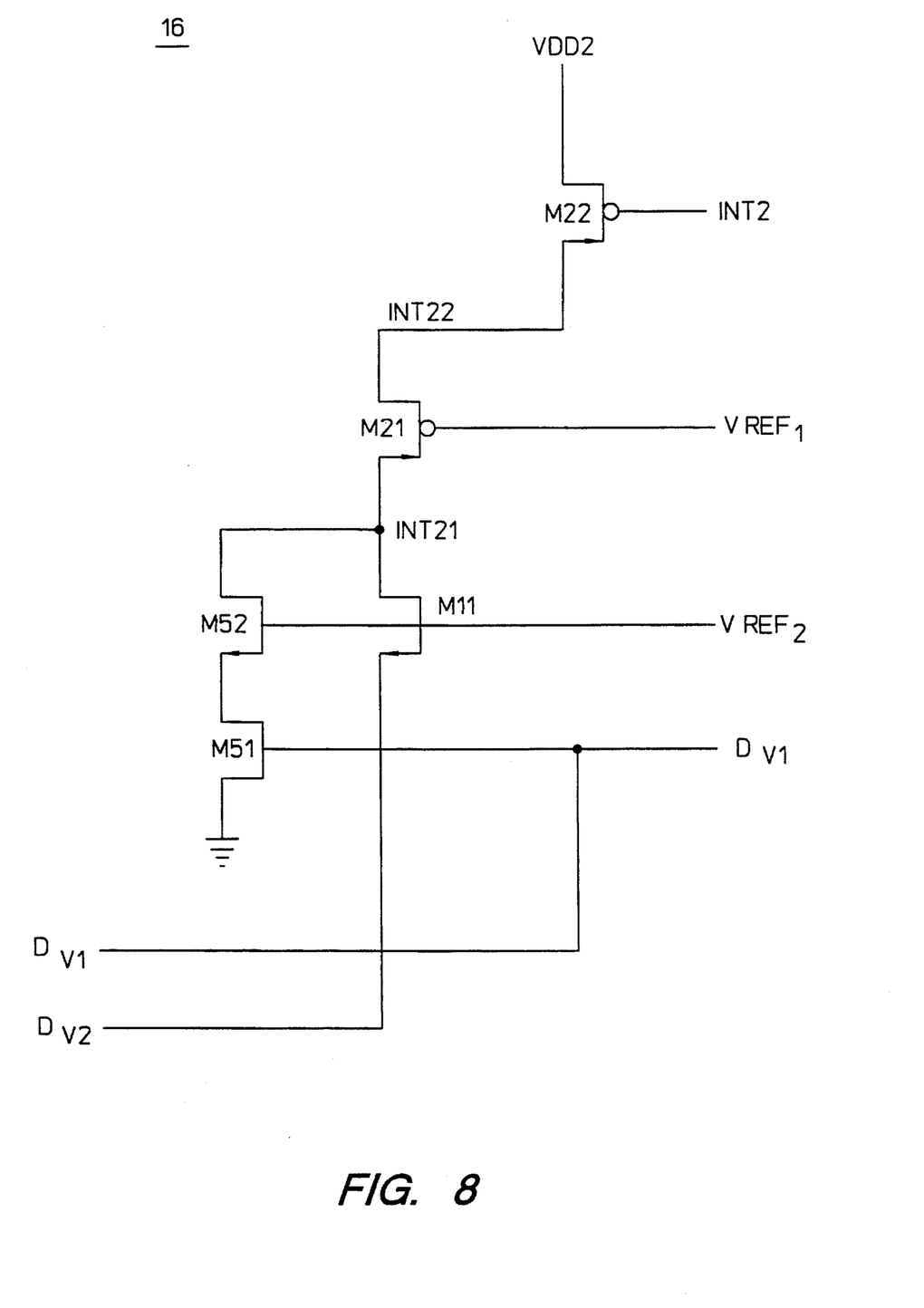
FIG. 8 is a circuit schematic diagram of the shift-down block shown in FIG. 1.

FIG. 8 is a circuit schematic diagram of the shift-down block 16 shown in FIG. 1. The gates of n-channel devices M11 and M52 receive the second reference signal $VREF_2$ from the voltage reference block 20 and their respective drains are connected together at node int21. The drain of p-channel device M21 is connected to node int21. The gate of p-channel device M22 is connected to node int2, and the drain and source of M22 are connected to voltage supply VDD2 and int22, respectively. The gate of M21 receives the first reference signal. $VREF_2$ from the voltage reference block 20. The source of n-channel device M51 is connected to ground while tile drain of M51 is connected to the source of M52. The discrete value signal $D_{V2}$ is available at the source of M11. The gate of M51 receives the discrete input signal $D_{V1}$ from the discrete buffer.

Figure 9A:
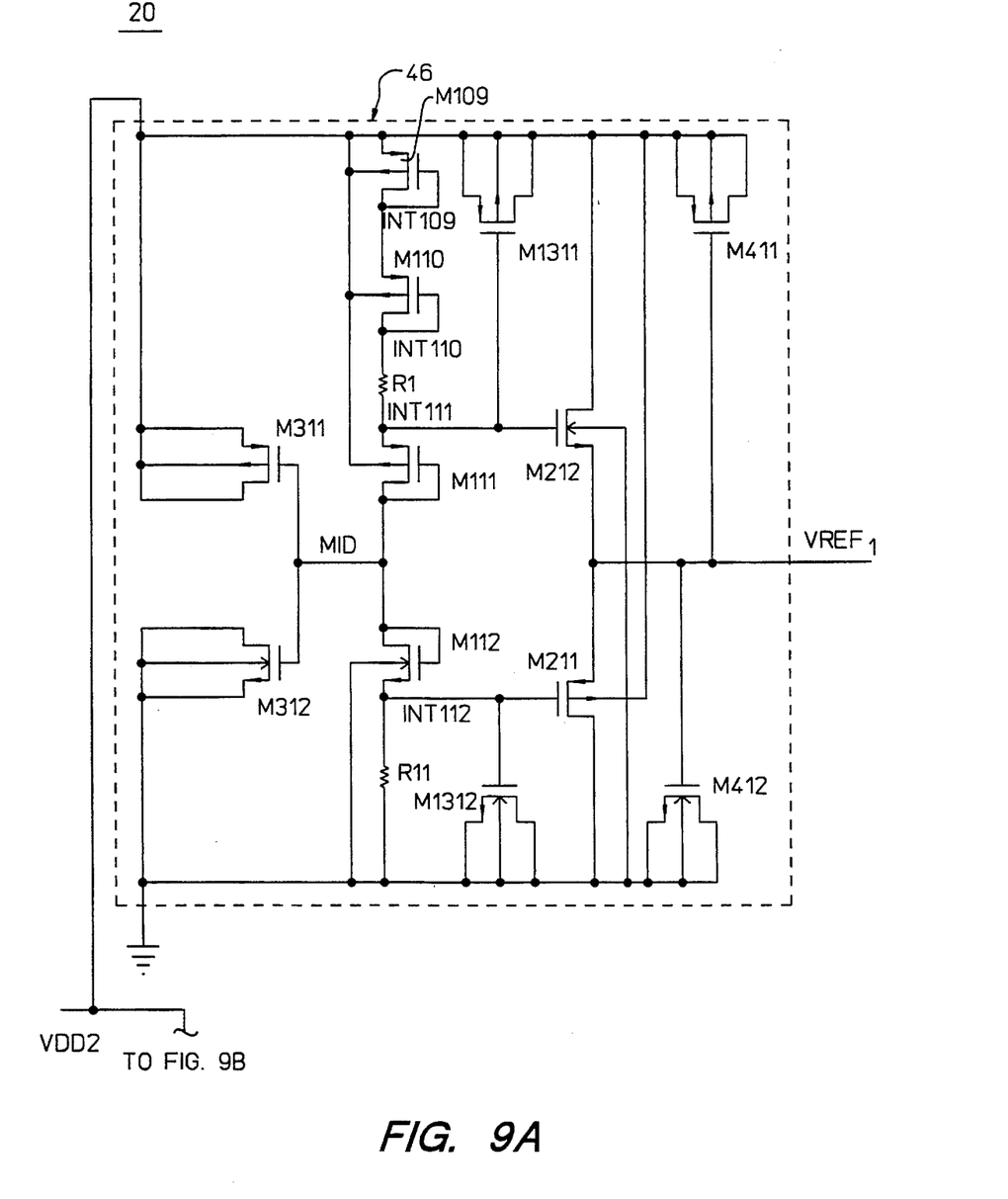
FIG. 9 is a circuit schematic diagram of the voltage reference block 20 shown in FIG. 1.
Figure 9B:
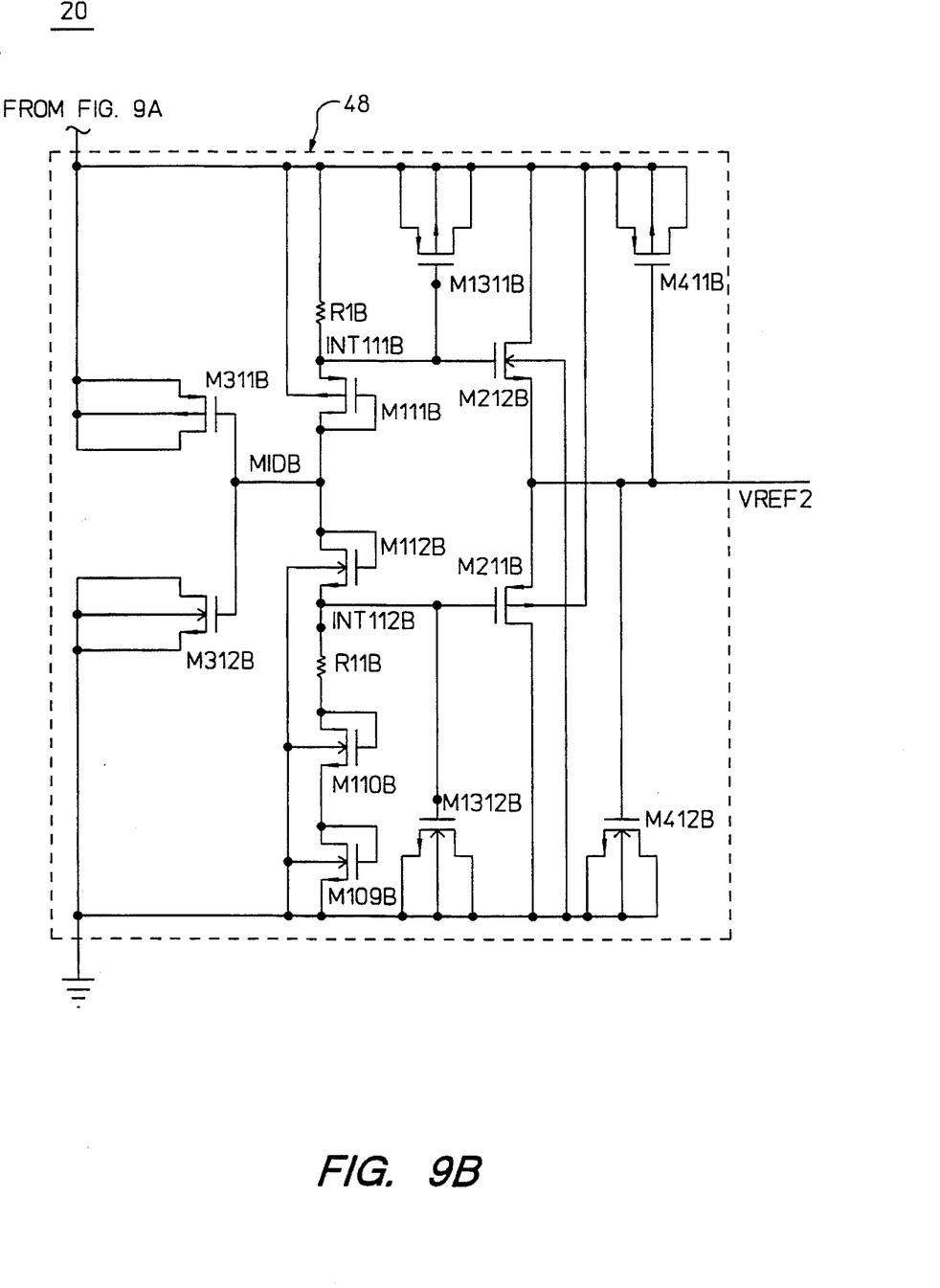

FIG. 9 is a circuit schematic diagram of the voltage reference block 20 shown in FIG. 1. Two voltage biasing circuits 46, 48 are used as biasing networks for each of the voltage distribution circuits. In this embodiment, two biasing circuits 46, 48 allow the core buffer block 12 and the discrete buffer block 18 to meet both the maximum device voltage and drive voltage requirements while improving delay performance. Both, the first and second biasing circuits 46, 48, receive the second voltage supply VDD2 as an input signal. The ratio of the output of each of the biasing circuits to VDD2 is fixed such that the gate to source or drain junction voltages of the input and output blocks are within the IC voltage range. The first biasing circuit 46 connects to the first voltage distribution circuit 34. The second biasing circuit 48 connects to the second voltage distribution circuit 36. In this embodiment, no device in either biasing circuit operates beyond the maximum device voltage for gate to drain or source and drain to source junctions for a field-effect transistor. The VDD2 input to the biasing circuits matches the drive voltage.

The first biasing circuit 46 has as an input signal the second voltage supply VDD2. Devices M109 and M110 are used as source follower level shifts, with node int110 approximately at $VDD2 - 2V_{tp}^+$ (P-channel). Devices M111 and M112 are used as level shifters along with R1 and R11 to set the bias level and reference voltage to M211 and M212. The voltages at node int111 and node int112 set the bias on M212 and M211. The output voltage is the voltage at node int111 $-V_{tn}$ (of M212) or the voltage at node int112 $+-V_{tp}$ (of M211). Devices M311, M312, M1311, M1312, M411, and M412 are used as "gate-oxide" capacitors. The size of these devices is determined such that as VDD2 ramps from 0 volts to ~5 volts the first biasing circuit has a ramped output voltage $VREF_1$ which matches the DC stable value.

The second biasing circuit 48 has as an input signal the second voltage supply VDD2. Devices M109B and M110B are used as source follower level shifts, with node int112B approximately at ground $+2V_{tn}$ (N-channel). Devices M111B and M112B are used as level shifters along with R1B and R11B to set the bias level and reference voltage to M211B and M212B. The voltages at node int111B and node int112B set the bias on M212B and M211B. The output voltage is the voltage at node int111B $-V_{tn}$ (of M212B) or the voltage at node int112B $+-V_{tp}$ (of M211B). Devices M311B, M312B, M1311B, M1312B, M411B, and M412B act as "gate-oxide" capacitors. The size of these devices is determined such that as VDD2 ramps from 0 volts to ~5 volts, the second biasing circuit has a ramped output voltage $VREF_2$ that matches the DC stable value.

From the foregoing, it will be appreciated that the present invention provides a method and apparatus for transforming voltage signals from the IC environment to the discrete environment and vice versa by using the same fabrication process containing complementary FETs for generating the integrated circuit. A CMOS-based bidirectional voltage transforming pad that embodies the principles of the invention is fabricated from the same process as the integrated circuit core but distributing the discrete voltage range so that each device may operate within the processing defined voltage constraints.

I claim:

1. An I/O circuit, for accessing an integrated circuit core, having bidirectional voltage transforming capability between the core and a discrete environment, the core producing a core output signal and the discrete environment producing a discrete input signal comprising:

a core buffer, connecting between a core voltage source and a ground, receiving the core output signal;

a shift-up circuit, connecting to the core buffer, receiving the core output signal and producing a first and a second core value signal, the first and second core value signals having a LOW and a HIGH value according to the core output signal;

a voltage reference circuit producing a first and a second reference signal;

a discrete buffer having an output terminal, receiving the reference signals and producing a discrete output signal according to the core output signal, and receiving the discrete input signal and producing a first discrete value signal having a LOW and a HIGH value according to the discrete input signal, comprising:

a first plurality of CMOS devices, connecting between a discrete voltage source and the output terminal, when the core output signal has the HIGH value distributing a discrete voltage according to the first reference signal across the first plurality and producing the discrete output signal having a LOW value, and a second plurality of CMOS devices, connecting between the output terminal and the ground, when the core output signal has the LOW value, distributing the discrete voltage according to the second reference signal across the second plurality and producing the discrete output signal having the HIGH value;

a shift-down circuit, connecting to the discrete buffer, producing a second discrete value signal having a LOW and a HIGH value according to the first discrete value signal; and the core buffer, connecting to the shift-down circuit, receiving the first and second discrete value signals and producing a core input signal within an IC voltage range.

2. The I/O circuit, as defined in claim 1, wherein the I/O circuit and the core have identical processing characteristics.

3. The I/O circuit, as defined in claim 1, the first plurality of CMOS devices further comprising:

a first p-channel field-effect transistor, having a source connected to the discrete voltage source, a gate receiving the first core value signal, and a drain; and a second p-channel field-effect transistor, having a source connected to the drain of the first p-channel field-effect transistor, a gate receiving the first reference signal, and a drain connected to the output terminal; and the discrete voltage being distributed across the first and second p-channel field-effect transistors such that a voltage drop across each of the first and second p-channel field-effect transistors is within the IC voltage range.

4. The I/O circuit, as defined in claim 1, the second plurality of CMOS devices further comprising:

a first n-channel field-effect transistor having a drain connected to the output terminal, a gate connected to the second reference signal, and a source; and a second n-channel field-effect transistor having a drain connected to the source of the first n-channel field-effect transistor, a gate receiving the second core value signal, and a source connected to the ground;

the discrete voltage being distributed across the first and second n-channel field-effect transistors such that a voltage drop across each of the first and second n-channel field-effect transistors is within the IC voltage range.

5. An I/O circuit pad for accessing a CMOS integrated circuit core having bidirectional voltage transforming capability between the CMOS integrated circuit core and a discrete environment comprising:

an arrangement of CMOS devices, wherein the CMOS devices and the CMOS integrated circuit Core have identical processing characteristics and processing defined voltage constraints, wherein a maximum voltage across each of the CMOS devices is within the processing defined voltage constraints, the arrangement of CMOS devices including:

a core buffer, connecting between a core voltage source and a ground, that receives a core output signal from the core;

a shift-up circuit, connecting to the core buffer, that receives the core output signal and outputs a first and a second core value signal having a LOW and a HIGH value;

a discrete buffer having an output terminal, receiving the first and second core value signals, producing a first discrete value signal, wherein the output terminal receives a discrete input signal from the discrete environment and produces a discrete output signal, the discrete buffer further including:

a first voltage distribution circuit, connecting between a discrete voltage source and the output terminal, when the core output signal has the HIGH value, distributing the discrete voltage according to a first reference signal and producing the discrete output signal having a LOW value, and a second voltage distribution circuit, connecting between the output terminal and the ground, when the core output signal has the LOW value, distributing the discrete voltage according to a second reference signal and producing the discrete output signal having a HIGH value; and a shirk-down circuit, connecting to the discrete buffer, that receives the first discrete value signal and produces a second discrete value signal, each discrete value signal having a LOW and a HIGH value;

the core buffer, connecting to the shift-down circuit, that receives the first and second discrete value signals and produces a core input signal;

the I/O circuit pad receiving the discrete input signal and producing the core input signal that is within a CMOS voltage range, the I/O circuit pad receiving the core output signal and producing the discrete output signal within a discrete voltage range.

6. The CMOS I/O circuit pad, as defined in claim 5, the first voltage distribution circuit further comprising:

a first p-channel field-effect transistor, having a source connected to the discrete voltage source, a gate receiving the first core value signal, and a drain; and a second p-channel field-effect transistor, having a source connected to the drain of the first p-channel field-effect transistor, a gate receiving the first reference signal, and a drain connected to the output terminal; and wherein the discrete voltage range is distributed across the first and second p-channel field-effect transistors such that a voltage drop across each of the first and second p-channel field-effect transistors is within the CMOS voltage range.

7. The CMOS I/O circuit pad, as defined in claim 5, the second voltage distribution circuit further comprising:

a first n-channel field-effect transistor, having a drain connected to the output terminal, a gate connected to the second reference signal, and a source; and a second n-channel field-effect transistor having a drain connected to the source of the first n-channel field-effect transistor, a gate receiving the second core value signal, and a source connected to the ground;

wherein the discrete voltage range is distributed across the first and second n-channel field-effect transistors such that a voltage drop across each of the first and second n-channel field-effect transistors is within the CMOS voltage range.

* * * * *